United States Patent [19]
Chao et al.

[11] Patent Number: 5,591,673
[45] Date of Patent: Jan. 7, 1997

[54] TUNGSTEN STUD PROCESS FOR STACKED VIA APPLICATIONS

[75] Inventors: Ying-Chen Chao; Chih-Heng Shen; Yi-Dong Yan, all of Hsin-chu, Taiwan

[73] Assignee: Taiwan Semiconductor Manufacturing Company Ltd., Hsin-Chu, Taiwan

[21] Appl. No.: 498,356

[22] Filed: Jul. 5, 1995

[51] Int. Cl.$^6$ .................... H01L 21/283; H01L 21/302
[52] U.S. Cl. ...................... 437/192; 437/195; 437/228
[58] Field of Search .................. 437/189, 192, 437/195, 228 ST, 228 T; 156/653.1; 257/752, 753, 758, 763

[56] References Cited

U.S. PATENT DOCUMENTS

| | | | |
|---|---|---|---|
| 4,520,041 | 5/1985 | Aoyama et al. | 427/88 |
| 4,592,802 | 6/1986 | Deleonibus et al. | 156/644 |
| 5,035,768 | 7/1991 | Mu et al. | 156/626 |
| 5,210,053 | 5/1993 | Yamagata | 437/192 |
| 5,286,675 | 2/1994 | Chen et al. | 437/195 |

FOREIGN PATENT DOCUMENTS 5-47706  2/1993  Japan.

OTHER PUBLICATIONS

Higelin, G., et al., "A Contact Filling Process With CVD-Tungsten . . . " V-MIC Conf., IEEE, Jun. 9-10, 1986, pp. 443-449.
Bollinger, C. A., et al., "An Advanced Four Level . . . ", V-MIC Conf., IEEE, Jun. 12-13, 1990, pp. 21-27.
Wolf, S., et al., Silicon Processing, vol. 1, 1986, Lattice Press, pp. 168-173, 348-353, 547-551.

*Primary Examiner*—T. N. Quach
*Attorney, Agent, or Firm*—George O. Saile

[57] ABSTRACT

A tungsten stud, stacked via process, has been developed, featuring smooth planar topographies at all metal levels. The desirable topography is obtained by allowing the tungsten stud to reside at the same level, or slightly above the level, of the top surface of the via hole insulator. This is achieved via an insulator etch back procedure, performed after metal stud formation.

26 Claims, 6 Drawing Sheets

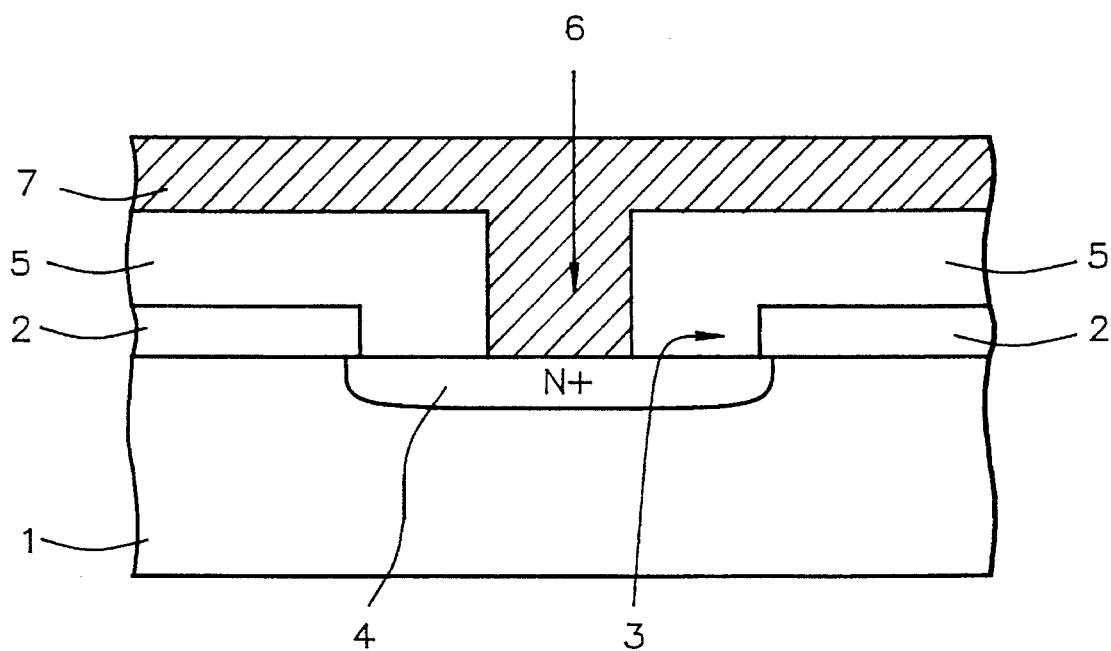
*FIG. 1 - Prior Art*
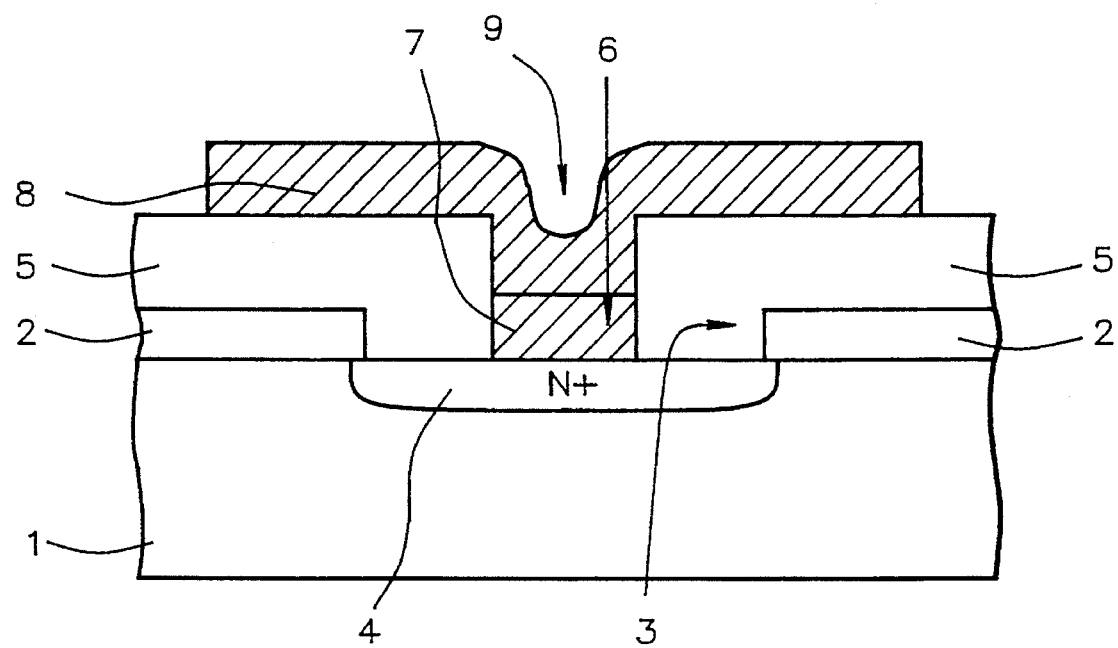
*FIG. 2 - Prior Art*

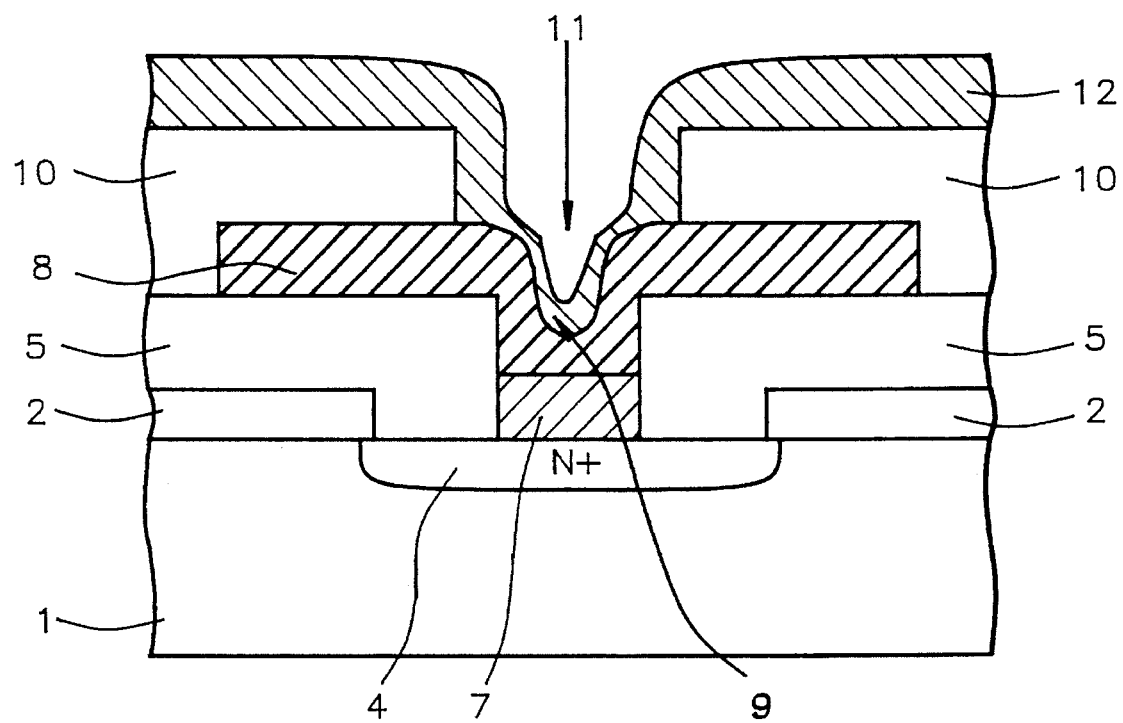
FIG. 3 – Prior Art
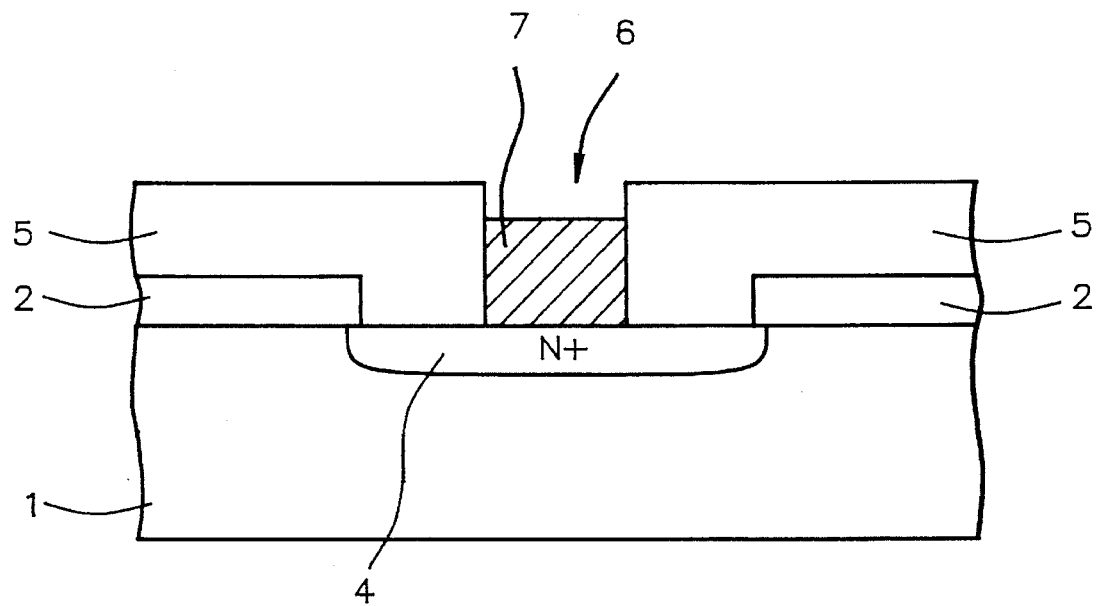
FIG. 4

5,591,673

TUNGSTEN STUD PROCESS FOR STACKED VIA APPLICATIONS

BACKGROUND OF THE INVENTION (1) Field of the Invention

The present invention relates to a process for manufacturing a semiconductor device, and more specifically to a method of forming metallization levels with smooth topographies on the semiconductor substrate.

(2) Description of the Prior Art

The trend in the semiconductor industry has been to continually increase device density, while maintaining or reducing the cost of semiconductor devices. The ability to significantly reduce dimensions, of critical device features, has enabled the semiconductor industry to fabricate more circuits on a specific size silicon chip, thus increasing device density. Cost reductions have also been realized by the ability of the industry to obtain smaller, and thus a greater amount of chips, for a specific size silicon wafer. Thus the trend to device micro-minaturazation has been, and is continuing to be, a strong objective of the semiconductor industry. Many semiconductor fabrication disciplines have been a major contributor in the realization of the micro-miniaturazation objective. For example more sophisticated exposure cameras, as well as more sensitive photoresist materials, have allowed the photolithographic discipline to routinely produce sub-micron images in photoresist. Anisotropic, reactive ion etching, (RIE), processes have in turn allowed the transfer of these sub-micron images, in photoresist, to be successfully transferred to underlying materials used in the fabrication of advanced silicon devices. Other semiconductor fabrication disciplines, such as low pressure chemical vapor deposition, (LPCVD), as well as ion implantation, have also been major contributors to the goal of micro-miniaturazation.

In addition to specific fabrication disciplines, aiding the advancement to smaller devices, several key processes have also been major contributors. For example, the ability to use sidewall spacers, by first depositing a material on a specific shape, and then anisotropically removing this material, everywhere except on the sides of the specific shape, has allowed the semiconductor industry to conserve valuable silicon area. Another technique employed to conserve silicon real estate, thus increasing device density, has been the stacked via approach. The stacked via approach is where basically all the vias or contacts, between interconnecting metallizations, or between a metallization and an underlying silicon device element, are created to reside on the same vertical axis. To successfully use the stacked via approach it is essential to create via hole metal fills, as planar, or as smooth as possible. For example if an irregularity, in terms of a metal seam exists in a lower via hole metal fill, this irregularity will be transferred to upper via hole metal fills, usually in a more exaggerated form then had existed for the lower via hole metal fills. This phenomena can result in metal discontinuities, leading to yield losses, or a lack of a sufficient amount of metal in the via hole, leading to possible electromigration failures due to increased current densities.

The attainment of smooth or planar metallizations has been addressed by Deleonibus, et al, in U.S. Pat. No. 4,592,802, and by Aoyama, et al, in U.S. Pat. No. 4,520,041, however these disclosures do not address the practical situation in which an overetch of the metal fill has to be performed, to clear the unwanted material from specific areas. The overetch will result in the metal fill residing well below the top surface if the via hole insulator, making it extremely difficult for subsequent via hole formation and metallizations to proceed in a planar manner. This invention will describe a process, which allows metal overetch, however uses a unique process that will allow subsequent via hole creation and metallization processes to still result in planar togographies.

SUMMARY OF THE INVENTION

It is an object of this invention to provide a process in which stacked vias can be fabricated, exhibiting planar via hole, metal fills.

It is another object of this invention to fill a via hole, in an insulator, with a metal and selectively etch back the metal to insure removal of the metal from all areas except in the via hole.

It is still another object of this invention to selectively remove some insulator material, that the via hole was formed in to allow the surface of the metal fill, in the via hole to be at the same level as the top surface of the insulator material.

It is still yet another object of this invention, to selectively remove an amount of insulator material, that the via hole was formed in, to allow the surface of the metal fill, in the via, to be higher then the top surface of the insulator material.

In accordance with the present invention a process is described for fabricating a stacked via process, using tungsten studs. An insulator layer is deposited on a semiconductor surface, which is comprised of exposed oxide, as well as exposed silicon regions. A via hole is formed in the insulator layer, exposing an underlying silicon region. A tungsten layer is deposited in the open via hole, as well as on the insulator surface, outside the via hole. A selective, anisotropic etch is used to remove all the tungsten from the surface of the insulator layer, followed by an overetch, to insure complete removal of the unwanted tungsten. The metal overetch results in the surface of the tungsten, in the via hole, being below the top surface of the insulator, therefore another selective etch is used, in this case to remove insulator material, to result in the tungsten fill being planar with the top surface of the via hole, or in some cases higher then the top surface of the via hole. An interconnecting metallization is then deposited, resulting in a planar layer on the underlying tungsten via hole fill, then patterned, followed by deposition of another insulator layer. The next via hole is then created, followed by creation of either another tungsten fill process, or another interconnecting metallization. If the tungsten via hole fill is used for this upper level via hole, identical processing, consisting of selective tungsten overetch, followed by selective insulator removal, is employed to result in the desired planarity.

BRIEF DESCRIPTION OF THE DRAWINGS

The object and other advantages of this invention are best described in the preferred embodiment with reference to the attached drawing that include;

FIGS. 1–3, showing prior art for stacked via structures.

FIG. 4, which schematically, in cross-sectional representation, shows an early stage of fabricating stacked via structures exhibiting planar surfaces.

DESCRIPTION OF THE PREFERRED EMBODIMENTS

Figure 5A:
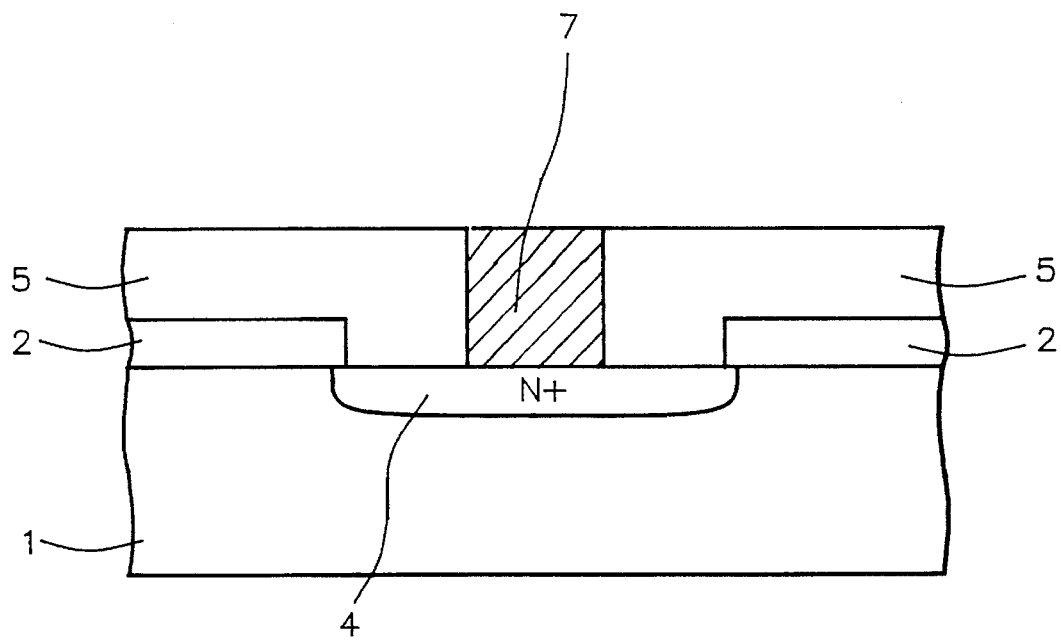
FIGS. 5a–5c, which schematically illustrate one embodiment of the planar stacked via structure.

The method of forming a planar stacked via structure will now be covered in detail. This structure can be used as part of metal oxide semiconductor field effect transistors, (MOSFET) devices that are currently being manufactured in industry, therefore only the specific areas unique to understanding this invention will be described in detail.

FIG. 1 schematically shows the prior art, used to achieve stacked via structures. A single crystalline silicon, P type substrate 1, having a <100> orientation is used. An oxide layer 2, is grown and patterned, using conventional photolithographic and dry etching techniques, to produce an opening, 3, in oxide layer 2. After photoresist removal and careful wet cleans, an N+ region, 4, is formed in the P type silicon via conventional ion implantation or conventional diffusion processes. A silicon oxide layer 5, is deposited using either atmospheric pressure chemical vapor deposition, (APCVD), or plasma enhanced chemical vapor deposition, (PFCVD), techniques, at a temperature between about 350° to 600° C., to a thickness between about 5000 to 8000 Angstroms. Standard photoresist and RIE processing, using $CHF_3$ and argon, are used to produce a first via hole 6. The process continues with the deposition of a metal, in this case tungsten, 7, via use of LFCVD, at a temperature between about 350° to 500° C. to a thickness between about 5000 to 9000 Angstroms. It is important that the thickness of tungsten be great enough to completely fill first via hole, 6. The choice of tungsten is based on the ability of this metal to withstand high current densities, in the contact hole, without the risk of electromigration failures. In addition the low solubility of tungsten in silicon, makes the risk of penetration failures, commonly seen with aluminum metallizations, remote.

The critical step next performed is the removal of unwanted tungsten from the surface of oxide layer, 5. This step is performed using a selective RIE process, which basically does not etch the underlying oxide layer, 5, at the conclusion of the tungsten etch. However to insure that all the tungsten is removed from all parts of the wafer, since the uniformity of the deposited metal is not 100%, a significant tungsten overetch is needed. This overetch results in a depression of the tungsten filled via, or tungsten stud, 7, in the first via hole 6. This is illustrated schematically in FIG. 2. Next a first interconnecting metallization, such as aluminum-copper, 8, or aluminum-copper-silicons deposited using r.f. sputtering is performed to a thickness between about 3000 to 5000 Angstroms. It however can be seen that the depressed tungsten stud, 7, led to a lack of complete planarity, resulting in an irregularity or metal seam, 9, in the first level interconnect metallization. FIG. 3 shows that the creation of the stacked via process, when applied to an underlying interconnecting metallization that exhibits this scenario, results in the transfer and enhancement of this irregularity to upper level layers. For example an interlevel dielectric layer, 10, is deposited, followed by conventional photolithographic and dry etching procedures, used to create a second via hole, 11. It can be seen in the stacked via approach the irregularity 9, is exposed. After photoresist removal, and careful wet cleans, a second level metallization, 12, has difficulty in depositing uniformally, due to the irregularity, 9, which was initially spawned by the depressed tungsten stud, 7. Therefore it is imperative that a stacked via structure start with a planar fill for the first via hole, so that irregularities are not transferred and enhanced with upper level via hole and metallization patterning.

Figure 5B:
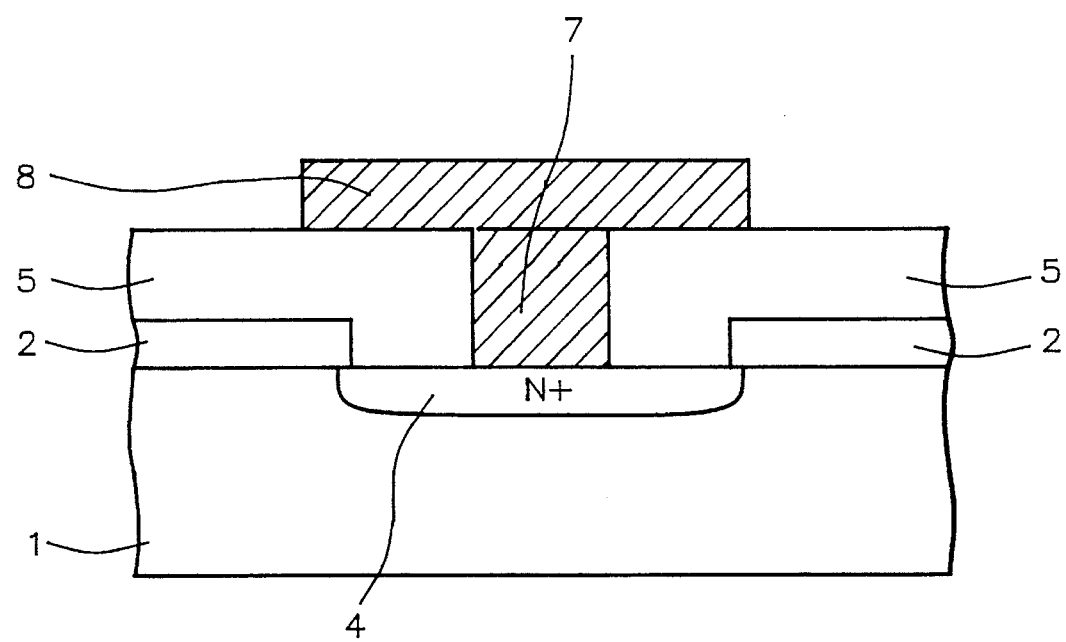
Figure 5C:
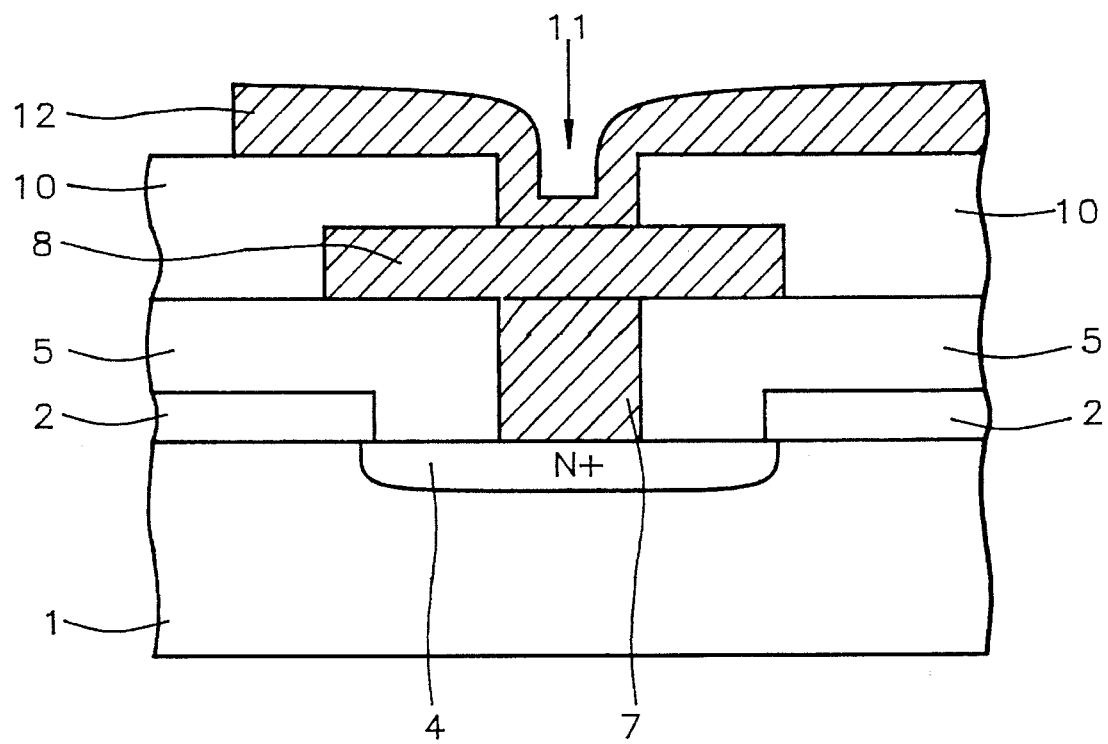

The process, designed to overcome the problem of seams or irregularities in various levels of metal studs or interconnects, will now be described. Referring now to FIG. 4, again a blanket, selective RIE-process is used to remove the unwanted tungsten, 7, from the surface of silicon oxide layer, and an additional RIE overetch, is performed to assure complete removal of any residual metal that may remain due to uniformity variations experienced with the metal deposition, creating the case in which the surface of the tungsten, 7, in the first via hole, 6, is below the surface of silicon oxide layer 5. As was seen with the prior art in FIGS. 1–3, severe irregularities in subsequent metallizations can now occur. FIGS. 5a–5c, will describe a first embodiment, designed to overcome the problem described with the prior art. Another selective RIE process, in this case designed to selectively remove silicon oxide layer 5, is applied to the structure shown in Fig. 4. The etchback is performed to remove a thickness of the silicon oxide layer, 5, between about 1000 to 2000 Angstroms. FIG. 5a, illustrates the case in which the controlled etchback resulted in the previously recessed tungsten stud, 7, in via hole, 6, now being planar in relation to the surface of silicon oxide layer, 5. The attainment of a planar structure, at this stage of processing, will enable subsequent processing to yield non-seamed stacked via structures.

Continuing with the structure shown in FIG. 5a, a first interconnecting metallization, 8, such as aluminum-copper, or aluminum-copper-silicon, is deposited, via r.f. sputtering, to a thickness between about 3000 to 5000 Angstroms. After the use of standard photolithographic and RIE procedures, using a chlorine based etchant, the first interconnect metallization structure, 8, is obtained, and shown schematically in FIG. 5b. It is important to note that the first interconnect metallization structure is smooth, not indicating irregularity, 9, observed with prior art in Fig. 2. After photoresist removal, via oxygen plasma ashing, followed by careful wet chemical cleans, an interlevel dielectric layer of silicon oxide, 10, is deposited using PECVD processing, at a temperature between about 300° to 500° C., to a thickness between about 1000 to 3000 Angstroms. Planarazation techniques, using chemical mechanical polishing, are used, followed by photolithographic and RIE processing, to create second via hole, 11. The RIE was performed using a $CHF_3$—$CF_4$-argon chemistry. This is seen in FIG. 5c. Finally a second interconnecting metallization, 12, such as aluminum-copper, or aluminum-copper-silicon, deposited via the use of r.f. sputtering, is performed to a thickness between about 3000 to 4000 Angstroms. Photolithographic and RIE processing, again using a chlorine based chemistry to etch the metal, produce second interconnect metallization structure, 12, exhibiting a planar contact to underlying first interconnect metallization, 8. The absence of irregularities, observed with prior art structures, is directly attributed to the initial planar tungsten stud, 7, obtained using the insulator etchback process.

Figure 6A:
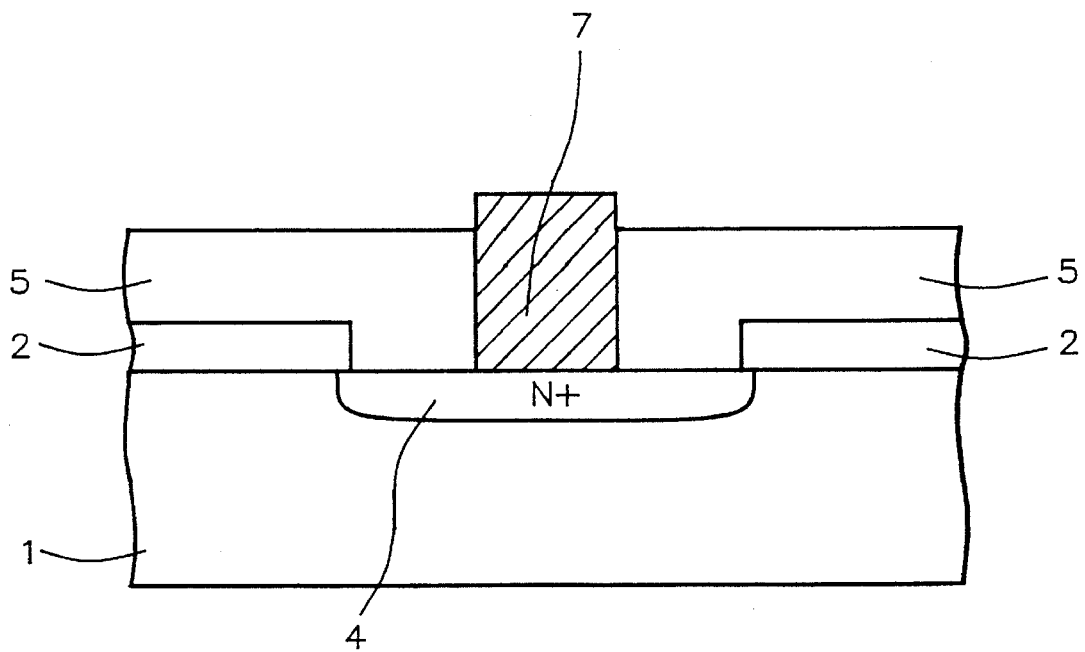
FIGS. 6a–6c, which schematically illustrate another optic, n used with the first embodiment of the planar stacked via structure.
Figure 6B:
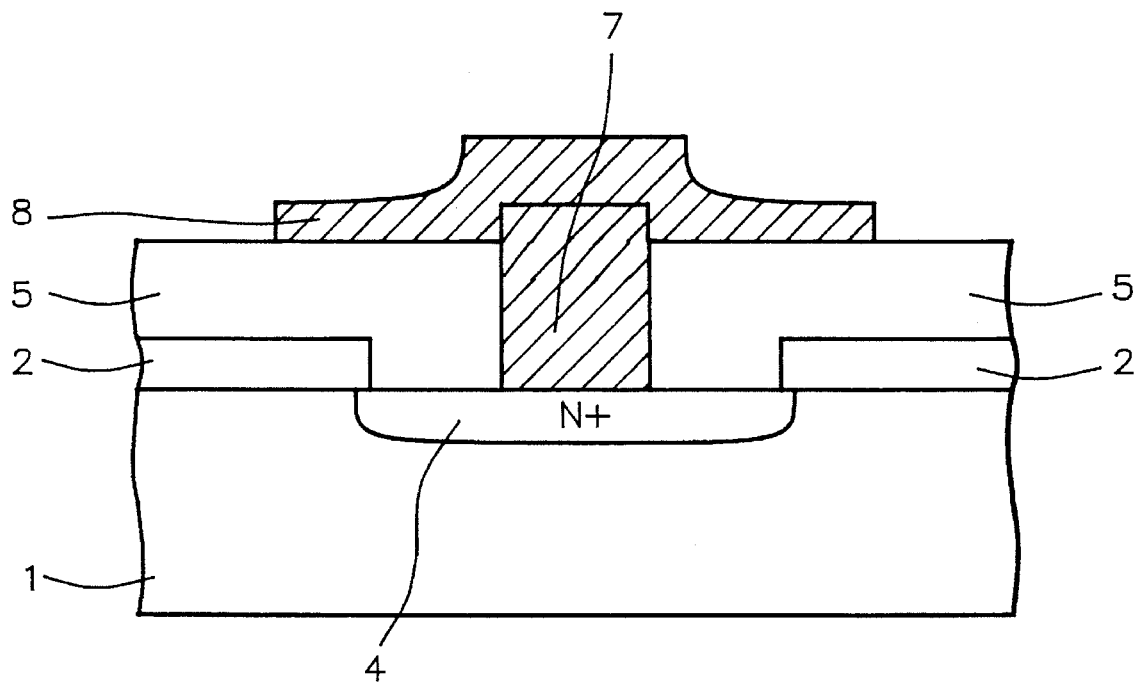
Figure 6C:
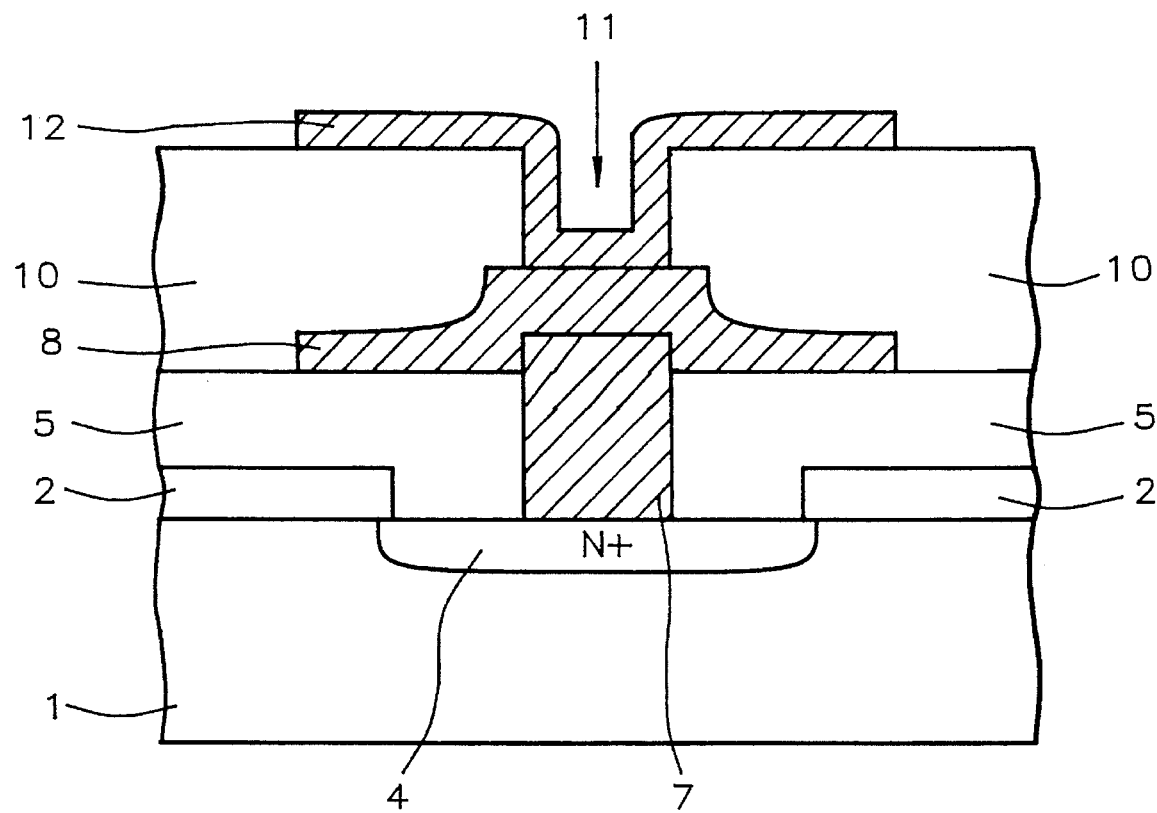

Referring back to the insulator etchback process, described in FIG. 5a, occasionally thickness variations in oxide layer, 5, may exist across a wafer. Therefore the resulting height of the tungsten stud structure, 7, in relation to the top surface of oxide layer, 5, may vary. The process is thus designed to account for these possible uniformity variations via a mild intentional overetch of oxide layer, 5, and thus in some regions of the wafer the tungsten stud, 7, may be higher then the top surf ace of oxide layer, 5. This is schematically illustrated in FIG. 6a. However the planar surface of tungsten stud 7, still allows the first level interconnect metallization, 8, to be formed without irregularities, as shown schematically in FIG. 6b. Formation of subsequent second via hole, 11, and second interconnect metallization, 12 are also, produced without severe topography problems, as shown in FIG. 6c. Again the smooth topography, obtained via the etchback of oxide layer, 5, did not allow the creation of metal seams and irregularities to be transferred to upper level structures.

Figure 7:
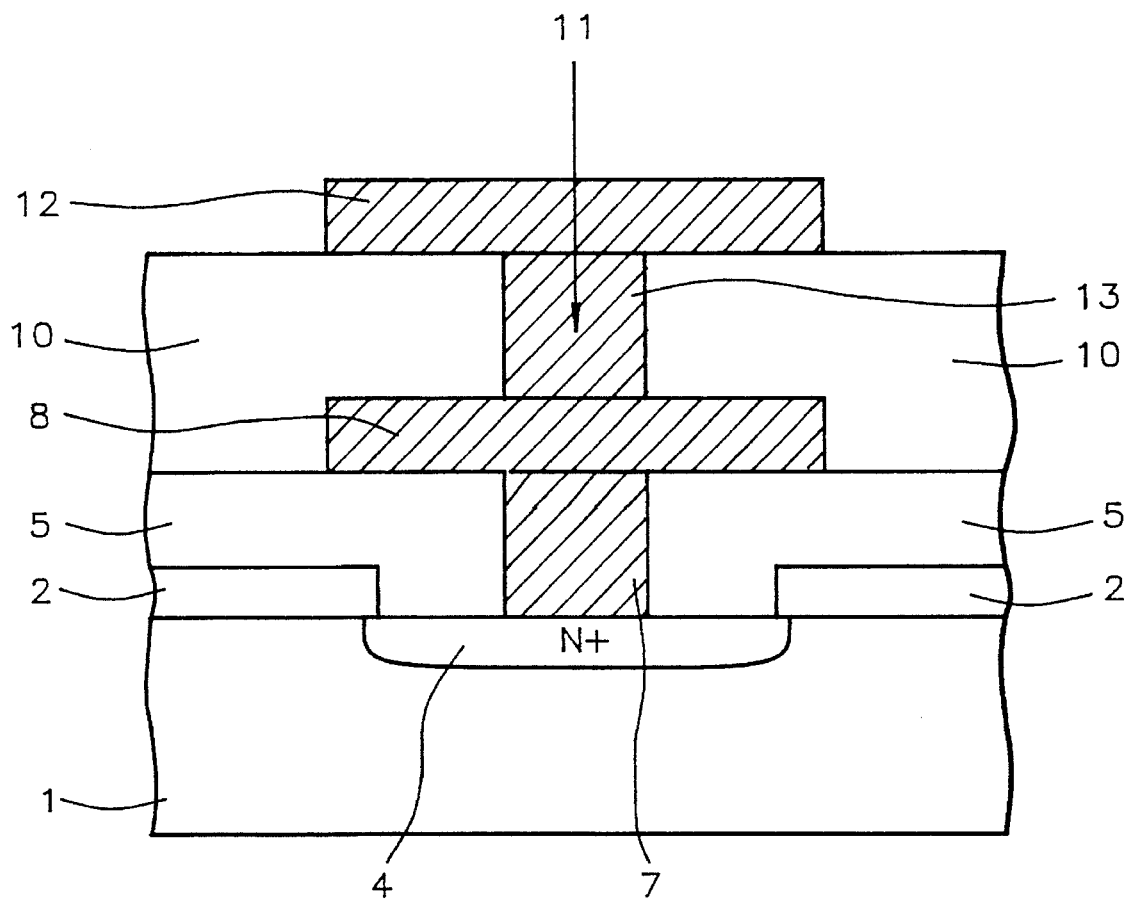
FIG. 7, which schematically illustrates a second embodiment of the planar stacked via structure.

A second embodiment of this invention is the use of a second tungsten stud structure connecting first and second interconnect metallizations. This is shown schematically in FIG. 7. After deposition of interlevel dielectric layer, 10, and formation of second via hole, using identical processing conditions as previously described, for this embodiment, shown in FIG. 7, another tungsten deposition is performed, rather than the aluminum interconnect layer previously used in the first embodiment. The unwanted tungsten is again removed via blanket, selective RIE process, again using conditions previously described for this procedure, and again resulting in a recessed tungsten stud structure, 13. However the key feature of this invention a blanket selective insulator RIE etchback, in this example applied to interlevel dielectric layer, 10, results in lowering the top surface of interlevel dielectric layer, 10, to a level in which tungsten stud 13, is now planar with the top surface of interlevel dielectric layer, 10. A second interconnect metallization structure, 12, is again created, using identical procedures used and described for the first embodiment. Again it can be seen in FIG. 7, that the resulting structures exhibit planarity, again attributable to the planarization steps initially employed via the blanket, selective insulator etchback process.

This invention for an improved tungsten stud process for stacked via applications, although described as a simple contact to an N type diffusion in a semiconductor substrate, can be applied to more complex complimentary metal oxide semiconductor, (CMOS), as well as to BiCMOS structures.

While this invention has been particularly shown and described with reference to, the preferred embodiments thereof, it will be understood by those skilled in the art that various changes in form and details may be made without departing from the spirit and scope of this invention.

What is claimed is:

1. A method for forming a stacked via structure, on a semiconductor substrate, including tungsten stud, formed without barrier or adhesive layers, and used to connect the underlying elements in said semiconductor substrate to overlying metal interconnect structures, comprising the steps of:

providing silicon elements, in said semiconductor substrate;

depositing a first silicon oxide layer, on said semiconductor substrate, and on said silicon elements;

opening a first via hole in said first silicon oxide layer, to expose said silicon elements;

depositing a tungsten layer, directly on said first silicon oxide layer, and on said silicon elements, in said first via hole, using LPCVD procedures at a temperature between about 350° to 500° C.;

removing said tungsten layer from surface of first silicon oxide layer, to create tungsten stud in said first via hole;

recessing said tungsten stud in said first via hole to a level between about 1000 to 1500 Angstroms, below the top surface of said first oxide layer;

removing between about 1000 to 2000 Angstroms of said first silicon oxide layer;

depositing a first interconnect metallization layer, on said first oxide layer, and on said tungsten stud, in said first via hole;

patterning said first interconnect metallization layer to form a first interconnect metal structure;

depositing a second silicon oxide layer, on said first interconnect metal structure, and on said first silicon oxide layer, not covered by said first interconnect metal structure;

opening a second via hole, in said second silicon oxide layer, directly over said first via hole, to expose said first interconnect metal structure;

depositing a second interconnect metallization layer, on said second silicon oxide layer, and on said first interconnect metal structure, in said second via hole; and patterning said second interconnect metallization layer to form second interconnect metal structure.

2. The method of claim 1, wherein said first silicon oxide layer is deposited using PECVD or APCVD, at a temperature between about 350° to 600° C., to a thickness between about 5000 to 8000 Angstroms.

3. The method of claim 1, wherein said first via hole is formed, in said first silicon oxide layer, via RIE processing using $CHF_3$–$CF_4$–argon.

4. The method of claim 1, wherein said tungsten layer, deposited at a temperature between about 350° to 500° C., is deposited to a thickness between about 5000 to 9000 Angstroms.

5. The method of claim 1, wherein said tungsten layer is removed from said first silicon oxide layer, via selective RIE processing, using a chlorine chemistry.

6. The method of claim 1, wherein RIE procedures are used to recess said tungsten stud in said first via hole, to a level between about 1000 to 1500 Angstroms below the top surface of said first oxide layer.

7. The method of claim 1, wherein RIE procedures are used to remove between about 1000 to 2000 Angstroms, of said top portion, of said first silicon oxide layer.

8. The method of claim 1, wherein said first interconnect metallization layer is aluminum-copper, or aluminum-copper-silicon, deposited using r.f sputtering, to a thickness between about 3000 to 5000 Angstroms.

9. The method of claim 1, wherein said second silicon oxide layer is deposited using PECVD processing, at a temperature between about 300° C. to 450° C., to a thickness between about 1000 to 3000 Angstroms.

10. The method of claim 1, wherein said second via hole is formed in said second silicon oxide layer, via RIE processing, using $CH_3$–$CF_4$–argon.

11. The method of claim 1, wherein said second interconnect metallization layer is aluminum-copper, or aluminum-copper-silicon deposited using r.f. sputtering, to a thickness between about 3000 to 5000 Angstroms.

12. A method for forming a stacked via structure, on a semiconductor substrate, consisting of planar metal interconnect structures, and planar metal via hole fills, with said planar metal via hole fills accomplished via direct deposition of tungsten on underlying silicon elements, comprising the steps of:

providing silicon elements, in said semiconductor substrate;

depositing a first silicon oxide layer, on said semiconductor substrate, and on said silicon elements;

opening a first via hole, in said first silicon oxide layer, to expose said silicon elements;

depositing a first tungsten layer, on said first silicon oxide layer, and directly on said silicon elements, in said first via hole, via use of LPCVD procedures, at a temperature between about 350° to 500° C.;

removing said tungsten layer from surface of first silicon oxide layer, to create a first tungsten stud, in said first via hole;

recessing said first tungsten stud, in said first via hole, to a level between about 1000 to 1500 Angstroms below the top surface of said first oxide layer;

removing between about 1000 to 2000 Angstroms of top portion of first silicon oxide layer;

depositing a first interconnect metallization layer, on said first oxide layer, and on said first tungsten stud, in said first via hole;

patterning said first interconnect metallization layer, to create a first interconnect metal structure;

depositing a second silicon oxide layer, on said first interconnect metal structure, and on said first silicon oxide layer, not covered by said first interconnect metal structure;

opening a second via hole, in said second silicon oxide layer, directly over said first via hole, to expose said first interconnect metal structure;

depositing a second tungsten layer, on said second silicon oxide layer, and on said first interconnect metal structure, in said second via hole;

removing said second tungsten layer from surface of second silicon oxide layer, to create a second tungsten stud, in said second via hole;

recessing said second tungsten stud, in said second via hole;

removing a top portion of said second silicon oxide layer;

depositing a second interconnect metallization layer, on said second silicon oxide layer, and on said second tungsten stud, in said second via hole; and patterning said second interconnect metallization layer to create second interconnect metal structure.

13. The method of claim 12, wherein said first silicon oxide layer is deposited using PECVD or APCVD, at a temperature between about 350° C. to 600° C., to a thickness between about 500 to 8000 Angstroms.

14. The method of claim 12, wherein said first via hole is formed in said first silicon oxide layer, via RIE processing using $CHF_3$–$CF_4$-argon.

15. The method of claim 12, wherein said first tungsten layer, deposited using LPCVD processing, at a temperature between about 350° C. to 500° C., is deposited to a thickness between about 5000 to 9000 Angstroms.

16. The method of claim 12, wherein said first tungsten layer is removed from said first silicon oxide layer, via RIE processing, using a chlorine chemistry.

17. The method of claim 12, wherein RIE procedures are used to recess said tungsten stud, in said first via hole, to a level between about 1000 to 1500 Angstroms below the top surface of said first silicon oxide layer.

18. The method of claim 12, wherein RIE procedures are used to remove between about 1000 to 2000 Angstroms of said top portion of said first silicon oxide layer.

19. The method of claim 12, wherein said first interconnect metallization layer is aluminum-copper, or aluminum-copper-silicon, deposited using r.f. sputtering, to a thickness between about 3000 to 5000 Angstroms.

20. The method of claim 12, wherein said second silicon oxide layer is deposited using PECVD processing, at a temperature between about 300° C. to 450° C. to a thickness between about 1000 to 3000 Angstroms.

21. The method of claim 12, wherein said second via hole is formed, in said second silicon oxide layer, via RIE processing using $CH_3$–$CF_4$-argon.

22. The method of claim 12, wherein said second tungsten layer is deposited using LPCVD processing, at a temperature between about 350° C. to 500° C., to a thickness between about 5000 to 9000 Angstroms.

23. The method of claim 12, wherein said second tungsten layer is removed, from said second silicon oxide layer, via RIE processing using chlorine chemistry.

24. The method of claim 12, wherein said second tungsten stud is recessed, in said second via hole, to a level between about 1000 to 1500 Angstroms below top surface of said second silicon oxide layer, via RIE processing using a chlorine chemistry.

25. The method of claim 12, wherein between about 1000 to 2000 Angstroms of said top, portion of said second silicon oxide layer is removed, via RIE processing using $CHF_4$–$CF_4$-argon.

26. The method of claim 12, wherein said second interconnect metallization layer is aluminum-copper, or aluminum-copper-silicon, deposited r.f. sputtering, to a thickness between about 7000 to 9000 Angstroms.

* * * * *